(12) United States Patent  (10) Patent No.: US 7,817,490 B1
Sridhara  (45) Date of Patent: Oct. 19, 2010

(54) LOW-POWER OPERATION OF STATIC MEMORY IN A READ-ONLY MODE

(75) Inventor: Srinivasa Raghavan Sridhara, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 87 days.

(21) Appl. No.: 12/423,378

(22) Filed: Apr. 14, 2009

(51) Int. Cl.
 *G11C 5/14* (2006.01)
 *G11C 11/00* (2006.01)

(52) U.S. Cl. .................. 365/227; 365/154; 365/156; 365/226

(58) Field of Classification Search .................. 365/227
See application file for complete search history.

(56) References Cited

U.S. PATENT DOCUMENTS

| | | | | |
|---|---|---|---|---|
| 4,095,281 | A * | 6/1978 | Denes | 365/156 |
| 4,525,810 | A * | 6/1985 | Cochran et al. | 365/102 |
| 5,724,292 | A * | 3/1998 | Wada | 365/207 |
| 6,597,620 | B1 * | 7/2003 | McMinn | 365/189.09 |
| 7,126,868 | B2 * | 10/2006 | Mizuno et al. | 365/203 |
| 7,512,030 | B2 * | 3/2009 | Houston et al. | 365/226 |
| 7,542,369 | B2 * | 6/2009 | Kenkare et al. | 365/226 |
| 2004/0130930 | A1 * | 7/2004 | Houston | 365/154 |
| 2005/0024917 | A1 * | 2/2005 | Yamaoka et al. | 365/145 |

OTHER PUBLICATIONS

Seevinck et al., "Static-Noise Margin Analysis of MOS SRAM Cells", J. Solid State Circ., vol. SC-22, No. 5 (IEEE, Oct. 1987), pp. 748-754.

Chang et al., "Stable SRAM Cell Design for the 32 nm Node and Beyond", Paper 8A-2, Digest of Technical Papers, 2005 Symposium on VLSI Technology (IEEE, 2005), pp. 128-129.

Takeda et al., "Redefinition of Write Margin for Next-Generation SRAM and Write-Margin Monitoring Circuit", Paper 34.5, Digest of Technical Papers, 2006 IEEE International Solid-State Circuits Conference, pp. 630-632.

* cited by examiner

*Primary Examiner*—Son L Mai
(74) *Attorney, Agent, or Firm*—Rose Alyssa Keagy; W. James Brady; Frederick J. Telecky, Jr.

(57) ABSTRACT

A static random access memory (SRAM) operable that is biased at lower power supply voltages in a read-only mode than in a read/write mode. The SRAM can be embedded within a large-scale integrated circuit, for example in combination with a microprocessor and associated circuitry. Upon system control circuitry determining that an SRAM array can be operated in a read-only mode, for example that a large number of read operations are likely to be performed prior to writing to the SRAM array, the power supply voltages applied to the SRAM array are reduced. The array power supply voltage and periphery power supply voltage can be at separate voltages and separately reduced from the read/write mode to the read-only mode. The read-only mode can be readily used for instruction cache memories, and for local instruction memories associated with an embedded microcontroller.

21 Claims, 6 Drawing Sheets

LOW-POWER OPERATION OF STATIC MEMORY IN A READ-ONLY MODE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuits. Embodiments of this invention are directed to controlling power supply voltages applied to static random-access memory (SRAM) in such integrated circuits.

Portable computing devices have become very popular in the marketplace in recent years, especially with the widespread deployment of wireless communications. For example, those cellular telephone handsets known as "smartphones" are essentially handheld computers that are capable of Internet browsing, email communications, digital audio and video downloading and playback, creation and editing of office documents, personal schedule and contact management, digital photography, and other functions, in addition to serving as a cellular telephone handset. Many of these smartphones are capable of carrying out data communications over the cellular network (e.g., using "3G" service) and in some cases also over conventional wireless network facilities and protocol (IEEE 802.11x). Both in these smartphones as well as in less capable handsets, a substantial amount of digital data processing is therefore carried out. As such, the electronic circuitry used in these devices often resembles a computer architecture, with a central processing unit, program memory and data memory stored in memory resources of the read-only memory (ROM) and random-access memory (RAM) types, cache memory, peripherals, co-processors, and the like, all of which communicate with one another over one or more system buses.

Power consumption is a critical factor in the design and functionality of these portable devices. Typically, power consumption of the electronic circuitry is reflected in the battery life of these devices, which of course is the time that the system can be operated from full charge until recharging of the battery is required. Battery life is an important factor in the marketplace acceptance of portable devices. In addition, the market also favors those devices offering the most functionality in the smallest physical form factor. However, thermal effects of power consumption constrain the extent to which these handheld systems can be miniaturized. For these and other reasons, it is desirable to minimize power consumption in these high-performance, high-capability, portable computing systems.

Memory resources in large-scale integrated circuits consume a substantial portion of the overall device power, largely because of the number of memory cells (i.e., transistors) involved in writing, reading, and maintaining data and program instructions for the data processing logic and digital signal processor functions. In addition, the substantial internal reactive load of relatively long and numerous row and column conductors in the memory arrays causes significant power dissipation during switching operations.

As known in the art, particularly in modern portable devices such as cellular telephone handsets and smartphones, random-access memory is often realized in the form of static RAM (SRAM). SRAM resources do not require periodic refreshing of the stored data state (as does dynamic RAM), and as such are especially attractive for realization of "embedded" RAM in the same integrated circuit as the programmable logic functions. More specifically, so-called "systems on a chip" that are commonly used to realize much, if not all, of the data and signal processing functionality of modern portable computing devices in a single integrated circuit, typically use SRAM to realize program memory, data memory, and cache memory.

BRIEF SUMMARY OF THE INVENTION

Embodiments of this invention provide substantial power savings in the operation of memory resources in a digital computing system.

Embodiments of this invention provide such power savings for a wide range of memory uses, particularly for embedded memory in large-scale computing systems that are integrated into a single integrated circuit.

Embodiments of this invention provide such power savings in a manner that is transparent to the user of the memory in such systems.

Other objects and advantages of this invention will be apparent to those of ordinary skill in the art having reference to the following specification together with its drawings.

An embodiment of this invention may be realized by identifying static random-access memory (SRAM) arrays to which many read operations are performed without requiring a write operation. For one or more of such identified SRAM arrays, once contents have been written, the memory is placed in a "read-only" mode in which the power supply voltage applied to bias the memory cells is reduced. If a separate power supply voltage biases the peripheral circuitry, from the voltage applied to the memory array, both power supply voltages can be reduced. This reduction in power supply voltage saves substantial power in the read-only operation of the SRAM array, without significant reduction of data stability. If a write is required to the array, the power supply voltage can be raised back to its nominal level to accomplish the write.

BRIEF DESCRIPTION OF THE SEVERAL VIEWS OF THE DRAWING

FIG. 1$b$ is an electrical diagram, in schematic form, of read circuitry in an SRAM resource constructed according to embodiments of the invention.

FIG. 1$c$ illustrates plots of static noise margin and write margin versus power supply voltage, as used in connection with embodiments of the invention.

DETAILED DESCRIPTION OF THE INVENTION

This invention will be described in connection with one of its embodiments, namely as implemented into a large-scale digital data or signal processing integrated circuit with embedded static random-access memory (SRAM), because it is contemplated that this invention is especially beneficial when realized in such an application. However, it is also contemplated that this invention can be used to substantial advantage in other applications, including SRAM memory and logic functions realized by way of multiple integrated circuits. Accordingly, it is to be understood that the following description is provided by way of example only, and is not intended to limit the true scope of this invention as claimed.

Figure 1A:
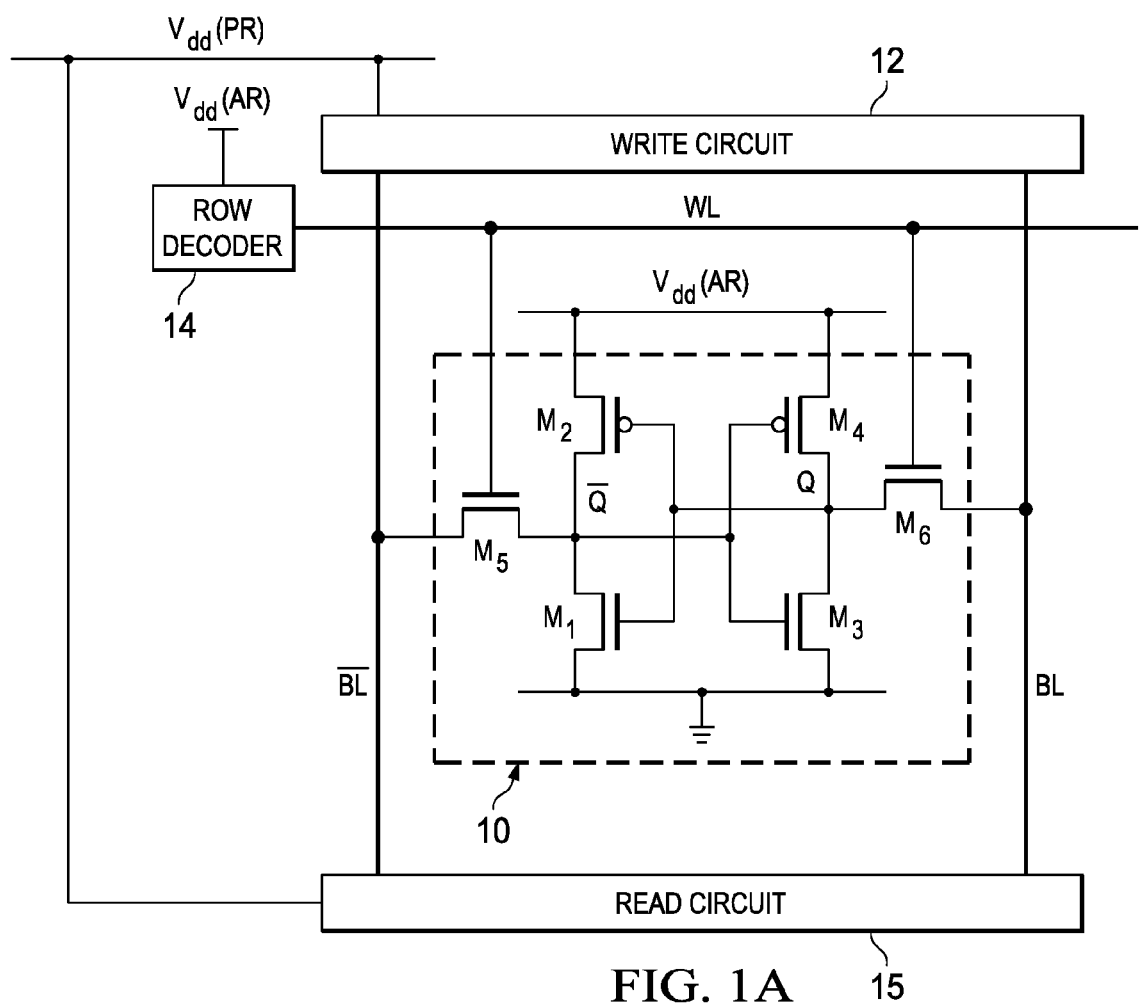
FIG. 1$a$ is an electrical diagram, in schematic form, of a static random access memory (SRAM) cell and its association with peripheral circuitry, in an SRAM array constructed according to embodiments of the invention.

As mentioned above, an embodiment of this invention is particularly useful in realizing and operating SRAM memory. FIG. 1a illustrates an example of SRAM cell 10, realized in this example in the well-known "6-T" (six transistor) arrangement. Those skilled in the art having reference to this specification will recognize that other SRAM cell arrangements (e.g., the "4-T, 2-R", or four-transistor, two-resistor, arrangement) can alternatively be used to realize SRAM cell 10. In the example of FIG. 1a, as is typical in the art, SRAM cell 10 is realized as a pair of cross-coupled inverters. One inverter, having an input at node Q and an output at node $\overline{Q}$, consists of n-channel metal-oxide-semiconductor (MOS) transistor $M_1$ and p-channel MOS transistor $M_2$ with their source-drain paths connected in series between array power supply voltage $V_{dd}(AR)$ and ground, and their gates connected together at node Q. The other inverter consists of n-channel MOS transistor $M_3$ and p-channel MOS transistor $M_4$ with their source-drain paths connected in series between array power supply voltage $V_{dd}(AR)$ and ground, and their gates connected together at node $\overline{Q}$. Node Q is coupled to bit line BL via n-channel MOS pass transistor $M_6$, and node $\overline{Q}$ is coupled to bit line $\overline{BL}$ via n-channel MOS pass transistor $M_5$. Word line WL is connected to and controls the gates of both pass transistors $M_5$, $M_6$.

Of course, SRAM cell 10 is replicated many times within an SRAM array, as known in the art. Those cells 10 sharing the same pair of bit lines BL, $\overline{BL}$ are considered as in the same column of such an array, and those cells sharing the same word line WL are considered as in the same row of the array; a typical SRAM array will of course have many rows and columns, numbering into the thousands in many cases. Various peripheral circuits are also provided for the SRAM array, as shown in FIG. 1a. In this example, row decoder 14 drives a selected one of multiple word lines WL in response to the row portion of an applied memory address, which selects the SRAM cells 10 associated with the selected word line WL for read or write access. Write circuit 12 drives bit lines BL, $\overline{BL}$ with a data state to be written to the SRAM cell 10 in the selected row in a write operation, while read circuit 15 receives bit lines BL, $\overline{BL}$ to sense the stored data state in the SRAM cell 10 in the selected row in a read operation. An example of the construction of read circuit 15 is provided below, in connection with FIG. 1b. Column decoder circuitry (not shown) can also be provided, to select one or more of the SRAM cells 10 in the selected row for access, in response to a column portion of the applied memory address. Other circuitry, including input/output buffers and drivers, etc., will also be provided with the SRAM array, as conventional in the art.

In the example of FIG. 1a, power is provided to SRAM cell 10 and its peripheral circuitry according to a "two-rail" power supply arrangement. As mentioned above, array power supply voltage $V_{dd}(AR)$ is applied to the sources of inverter transistors $M_2$, $M_4$ in the cross-coupled inverters of SRAM cell 10. In addition, row decoder 14 is also biased by array power supply voltage $V_{dd}(AR)$, as shown in FIG. 1a. On the other hand, write circuit 12, read circuit 15, and other circuitry (not shown) peripheral to SRAM cell 10, are biased by periphery power supply voltage $V_{dd}(PR)$. In operation, array power supply voltage $V_{dd}(AR)$ will appear as a full rail voltage at word line WL (perhaps bootstrapped to a slightly higher voltage from this voltage) in both read and write operations. Periphery power supply voltage $V_{dd}(PR)$ will appear as a full rail voltage at one or the other of bit lines BL, $\overline{BL}$ during write operations, and will also bias read circuit 15 during both read and write (i.e., read/write) operations. In this two-rail implementation, power supply voltages $V_{dd}(AR)$, $V_{dd}(PR)$ are set to different voltages from one another, for example by a voltage regulator or power management circuit.

Figure 1B:
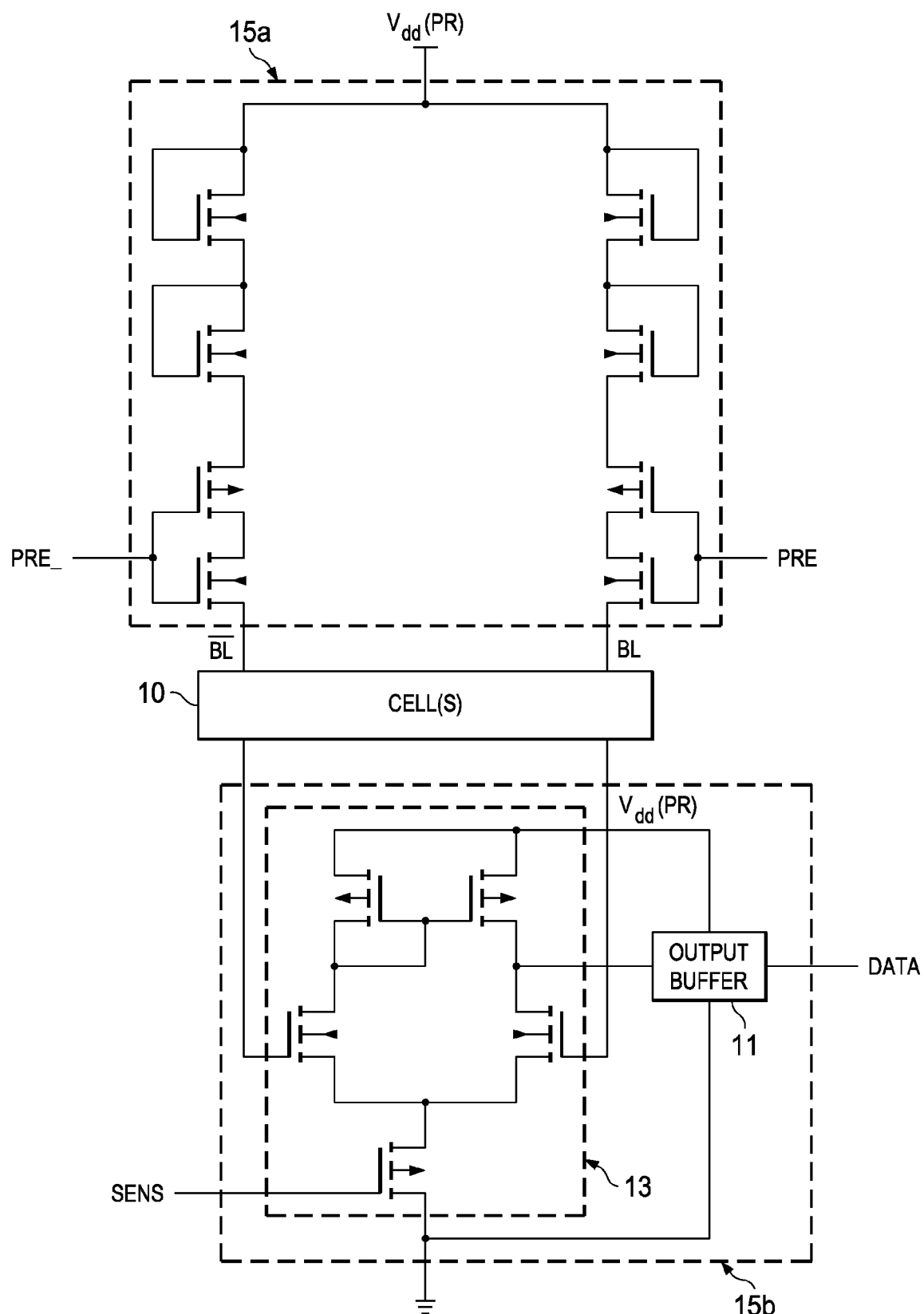

FIG. 1b illustrates an example of the construction and biasing of read circuit 15, in connection with this embodiment of the invention. As shown in FIG. 1b, read circuit 15 is arranged into portions 15a, 15b on opposite sides of a column of SRAM cells 10; of course, many columns of cells 10 will be provided within a typical static RAM instance. In this example, precharge circuitry portion 15a includes a series of MOS transistors between each of bit lines BL, $\overline{BL}$ and periphery power supply voltage $V_{dd}(PR)$. In this example, as is typical in the art, two of these MOS transistors in each series arrangement are biased in diode fashion to establish a desired voltage drop for bit lines BL, $\overline{BL}$ when precharged, and two other transistors constitute respective CMOS inverters to selectably connect this voltage to bit lines BL, $\overline{BL}$ during precharge, in response to control signals PRE, PRE_; of course, precharge circuitry portion 15a may be constructed in an alternative fashion. On the opposite side of cells 10 from precharge circuitry portion 15a, sense circuitry portion 15b includes sense amplifier 13 connected to bit lines BL, $\overline{BL}$, and constructed in the conventional manner to produce an output state that is buffered by output buffer 11, and presented on line DATA. Again, sense circuitry portion 15b is shown by way of example only in FIG. 1b, and may alternatively be constructed according to other approaches. In this example, sense amplifier 13 is a "single-tail" amplifier, enabled by control signal SENS. And, as shown in FIG. 1b, sense amplifier 13 and output buffer 11 are each biased by periphery power supply voltage $V_{dd}(PR)$.

As discussed above, in this two-rail implementation, power supply voltages $V_{dd}(AR)$, $V_{dd}(PR)$ are set to different voltages from one another. Alternatively, in a "single-rail" arrangement, a single power supply voltage will drive both power supply voltages $V_{dd}(AR)$, $V_{dd}(PR)$ in common. In such a case, SRAM cells 10, row decoder 14, and the peripheral circuitry of write circuit 12, read circuit 15, etc. will all be biased to that same voltage As known in the art, an important measure of the performance of an SRAM memory is the stability of its stored data states relative to noise, or perturbations, appearing on bit lines BL, $\overline{BL}$. As conventional in the art, different measures of SRAM cell stability apply to read and write operations. Stability during a read cycle is referred to as "static noise margin", which is generally defined as the maximum noise voltage applied at nodes Q, $\overline{Q}$ via pass transistors $M_6$, $M_5$ respectively, that can be tolerated by SRAM cell 10 without changing its state. The stability measure of "write margin" is typically defined as the amount of noise at bit line BL that can be tolerated by SRAM cell 10 in a state with node Q high and pass transistors $M_5$, $M_6$ turned on, during a write operation in which node Q is being written to a low state.

Figure 1C:
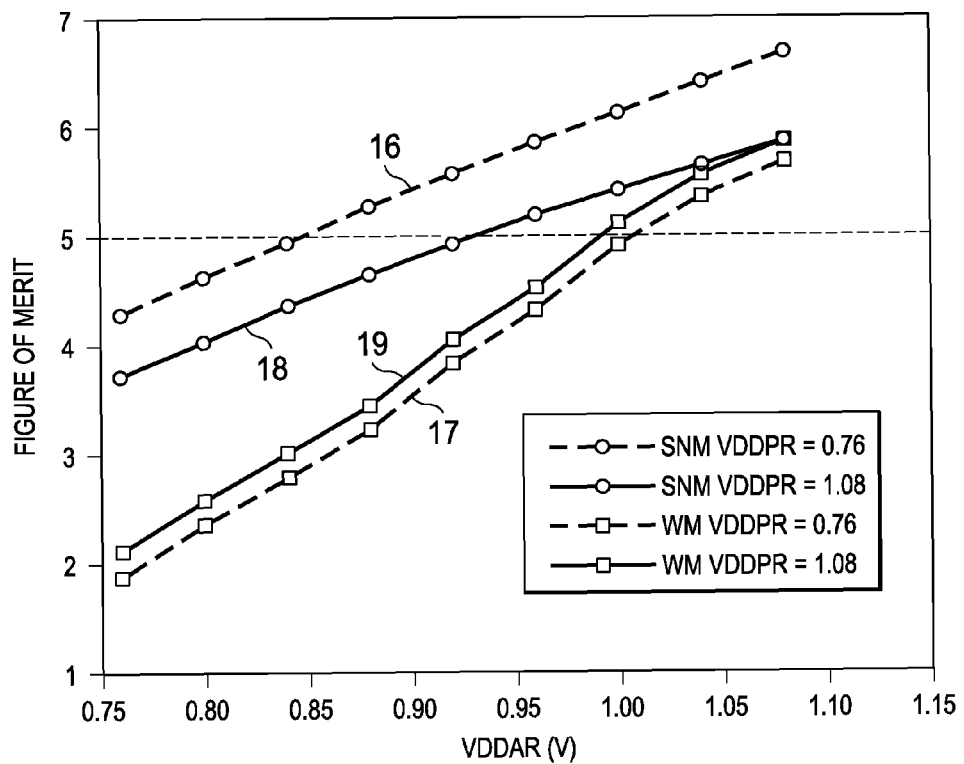

It has been discovered, according to this invention, that the static noise margin and write margin for a typical SRAM cell 10 both vary with varying power supply voltages, but will vary differently from one another. FIG. 1c illustrates this difference, by way of its plots 16, 17, 18, 19 of a stability "figure of merit" versus array power supply voltage $V_{dd}(AR)$, in a "two-rail" SRAM array in which periphery power supply voltage $V_{dd}(PR)$ can differ from array power supply voltage $V_{dd}(AR)$. In this case, this "figure of merit" (FOM) is a statistical measure of margin measurement (e.g., over a number of SRAM cells 10), defined as:

$$FOM = \frac{\bar{x} - 3(\sigma_{global})}{\sigma_{local}}$$

where $\bar{x}$ is the mean measured value of the particular margin, $\sigma_{global}$ is the standard deviation of the measured margin over global process variations (i.e., variations in transistor parameters from chip to chip), and $\sigma_{local}$ is the standard deviation of the measured margin over local process variations (i.e., transistor parameter mismatches within SRAM cells 10 on the same chip). Of course, other statistical or other measures of the particular margin measurement may alternatively be considered, and are expected to show similar behavior versus power supply voltage as that shown in FIG. 1c.

Plot 16 illustrates the FOM of the static noise margin of SRAM cells 10 versus array power supply voltage $V_{dd}(AR)$, at a periphery power supply voltage $V_{dd}(PR)$ of 0.76 volts. As evident from plot 16, static noise margin decreases with decreasing array power supply voltage $V_{dd}(AR)$. Plot 18 shows this same static noise margin of SRAM cells 10 versus array power supply voltage $V_{dd}(AR)$, but at a higher periphery power supply voltage $V_{dd}(PR)$ of 1.08 volts. As evident from FIG. 1c, plot 18 shows a similar trend of static noise margin versus array power supply voltage $V_{dd}(AR)$ as plot 16, but at an overall poorer FOM value for corresponding array power supply voltages $V_{dd}(AR)$ than that observed at the lower periphery power supply voltage of 0.76 volts. Plot 17 shows the variation of write margin of SRAM cells 10 versus array power supply voltage $V_{dd}(AR)$, at a periphery power supply voltage $V_{dd}(PR)$ of 0.76 volts, while plot 19 shows the variation of write margin versus array power supply voltage $V_{dd}(AR)$ at a periphery power supply voltage $V_{dd}(PR)$ of 1.08 volts. As evident from plots 17, 19, the write margin also decreases with decreasing array power supply voltage $V_{dd}(AR)$ at both values of periphery power supply voltage $V_{dd}(PR)$, but improves slightly with increasing periphery power supply voltage $V_{dd}(PR)$.

It has therefore been discovered, in connection with this invention, that write margin decreases faster with decreasing array power supply voltage $V_{dd}(AR)$ than does static noise margin, and that the write margin level is generally more limiting to the stability of the SRAM data state than is static noise margin. This difference is especially evident if one analyzes performance at a selected minimum FOM level. For the example of FIG. 1b, to maintain a minimum FOM=5.0, this SRAM can be operated at a much lower array power supply voltage $V_{dd}(AR)$ (as low as approximately 0.84 volts) in read operations than in write operations (which require array power supply voltage $V_{dd}(AR)$ to be at least 0.99 volts for proper operation). In addition, the lower periphery power supply voltage of 0.76 volts allows an array power supply voltage $V_{dd}(AR)$ of 0.84 volts for read operations, while a periphery power supply voltage $V_{dd}(PR)$ requires an array power supply voltage $V_{dd}(AR)$ of 0.93 volts to attain this FOM=5.0.

This invention takes advantage of this difference in read and write stability, over varying power supply voltage levels, to reduce the power consumption of the SRAM memory array if one is confident that the memory will be used in a particular manner. More specifically, in this embodiment of the invention, those SRAM arrays that are seldom (if ever) written to in normal operation can be biased to a much lower array power supply voltage $V_{dd}(AR)$ and a much lower periphery power supply voltage $V_{dd}(PR)$, while still providing adequate static noise margin for read operations. According to this embodiment of the invention, those "read-only" SRAM arrays are identified based on their contents and mode of use, and their power supply voltages adjusted accordingly.

Figure 2:
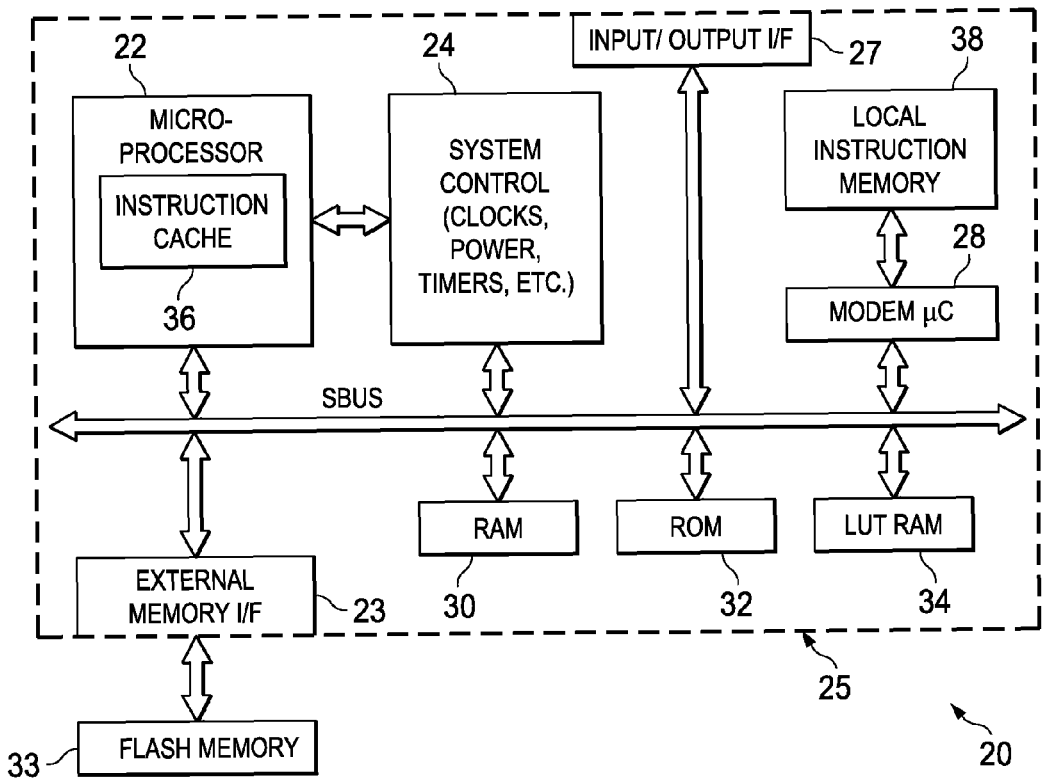
FIG. 2 is an electrical diagram, in block form, of a system-on-a-chip including embedded SRAM memory resources, constructed according to embodiments of the invention.

FIG. 2 illustrates an example of a digital data or signal processing system 20 in which embodiments of the invention can be realized. In this example, system 20 is realized according to a "system-on-a-chip" architecture, in which an effectively complete computer architecture including a central processing unit, control circuitry, and memory resources, is realized by a single integrated circuit 25. Of course, the architecture illustrated in FIG. 2 is presented by way of example only. It is to be understood by those skilled in the art, having reference to this specification, that this embodiment of the invention can be readily implemented in many different and varied architectures from that shown in FIG. 2.

According to this example, microprocessor 22 serves as the central processing unit of system 20, and is realized within integrated circuit 25 in communication with system bus SBUS. Microprocessor 22 may correspond to a general purpose programmable microprocessor, as known in the art, or may instead or additionally correspond to an application-specific programmable microprocessor such as a digital signal processor. System control circuit 24 in integrated circuit 25 is coupled to microprocessor 22, for example by way of a connection to system bus SBUS or by way of a direct connection, and includes such control circuitry as clock generators, timers, power management functions, reference voltage and reference current generator circuits, and other conventional circuit functions known in the art to be useful for the control and operation of functions in this architecture. In this example, system 20 corresponds to the primary electronic system in a cellular telephone handset capable of voice and data communications. As such, system 20 in this example includes modem microcontroller 28, which carries out the appropriate modulating and demodulating of baseband signals into and from the desired RF communications physical layer protocol. Input/output interface function 27 couples system bus SBUS to external peripheral functions (not shown), such as a display, keypad, USB ports, and the like.

Various memory resources are available in the architecture of system 20 shown in FIG. 2. General purpose access memory (RAM) 30 is provided and connected to system bus SBUS, for use as program and data memory available to microprocessor 22 and modem microcontroller 28. Some or all of RAM 30 may be implemented as static RAM, in this example. System bus SBUS is also connected to read-only memory (ROM) 32, which can serve as non-volatile program storage. ROM 32 may be realized by mask-programmable ROM memory, or alternatively as an electrically programmable memory resource, for example fabricated as on-chip "flash" EEPROM memory. Look-up table (LUT) RAM 34 is also connected to system bus SBUS, and represents an SRAM array that is dedicated for use as a programmable look-up table.

External memory interface 23 is provided within integrated circuit 25, and is coupled to system bus SBUS and to a physical port or interface to which external flash (EEPROM) memory 33 is connected. As will be discussed further below, this external flash memory 33 can store program and data information that becomes available in the event of an internal cache miss.

Cache memory resources can be created internal to the logic functions of system 20. For example, as shown in FIG. 2, microprocessor 22 includes instruction cache memory 36, which is useful to store executable instruction code recently fetched from another memory resource, such as external flash memory 33. Modem microcontroller 28 in this example is associated with its own local instruction memory 38, which is not necessarily implemented as a cache, but to which modem microcontroller 28 can "download" its own instruction code, as will be described in further detail below. Each of instruction cache memory 36 and local instruction memory 38 can be realized as SRAM arrays, according to embodiments of this invention.

As will be described below, LUT RAM 34, instruction cache 36, local instruction memory 38, and perhaps a separate array portion within RAM 30, can be constructed to take advantage of the ability to lower array power supply voltage $V_{dd}(AR)$ in a "read-only" mode. According to embodiments of this invention, one, some, or all of these SRAM memories in integrated circuit 25 can be realized in the manner illustrated by SRAM 35 shown in FIG. 3, and which will now be described.

Figure 3:
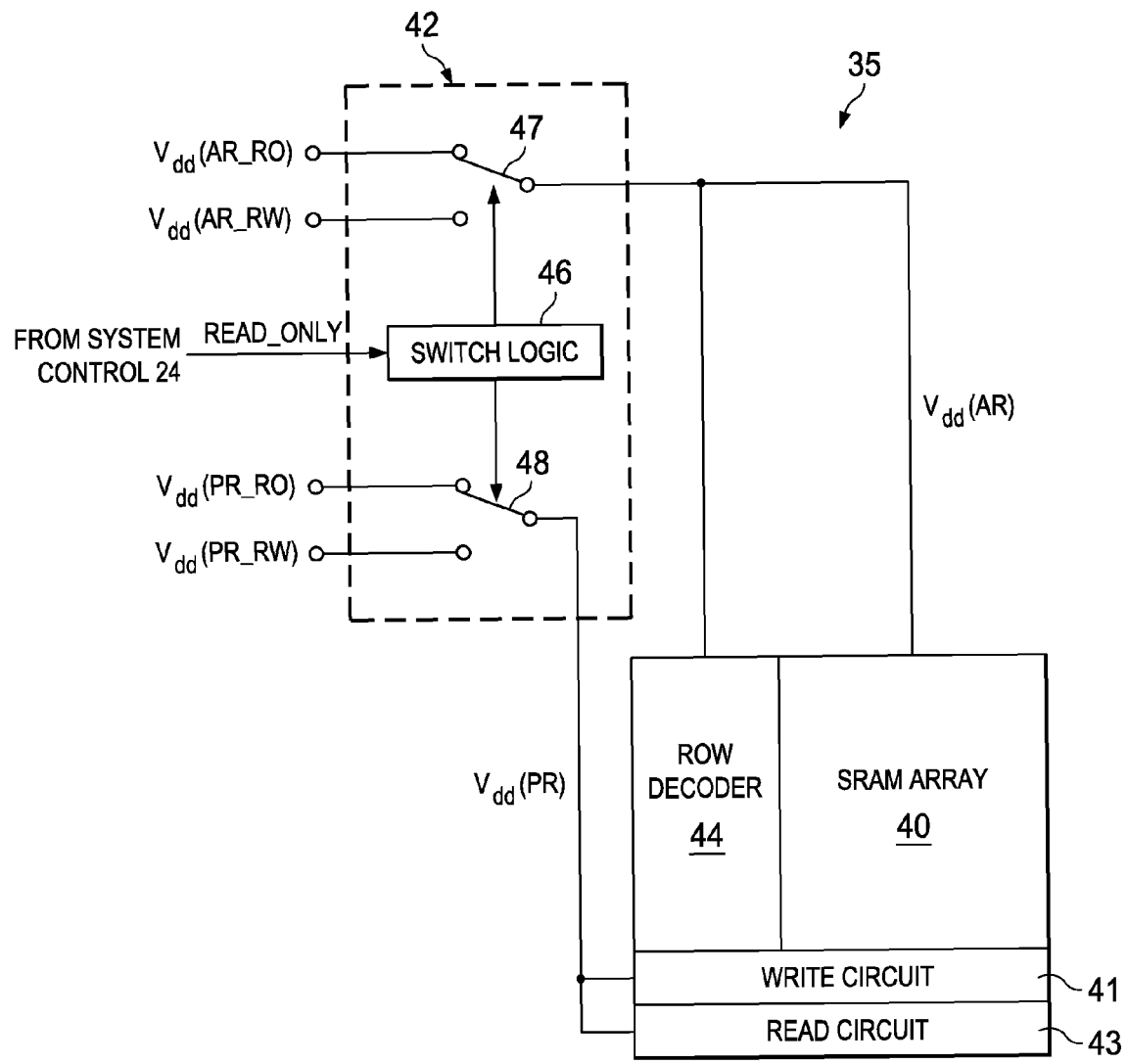
FIG. 3 is an electrical diagram, in block form, of an SRAM memory resource of the system of FIG. 2, constructed according to an embodiment of the invention.

As shown in FIG. 3, SRAM 35 includes array 40, which includes a number of SRAM cells 10 arranged in rows and columns, in the usual manner. SRAM cells 10 in array 40 are each biased by array power supply voltage $V_{dd}(AR)$, in this example. SRAM 35 is also provided with write circuit 41, read circuit 43, row decoder 44, and such other peripheral circuitry as useful in connection with the operation of this memory resource. In this embodiment of the invention, a "two-rail" power supply scheme is used, and as such peripheral circuitry such as write circuit 41 and read circuit 43 are biased by periphery power supply voltage $V_{dd}(PR)$, which can be at a different voltage from array power supply voltage $V_{dd}(AR)$, as described above. As mentioned above, it is contemplated that decoder circuitry such as row decoder 44 will typically be biased by array power supply voltage $V_{dd}(AR)$, although periphery power supply voltage $V_{dd}(PR)$ may alternatively bias the decoders.

According to this embodiment of the invention, power supply switch circuitry 42 controls the selection of the voltage to be forwarded to array 40 and row decoder 44 as array power supply voltage $V_{dd}(AR)$, and controls the selection of the voltage to be forwarded to write circuit 41 and read circuit 43 as periphery power supply voltage $V_{dd}(PR)$. In this example, two separate voltages are available for each of array power supply voltage $V_{dd}(AR)$ and periphery power supply voltage $V_{dd}(PR)$—one voltage for use in a "read-only" operating mode, and the other for use in a "read/write" mode in which both reads and writes can be performed. It is contemplated that these available power supply voltages are generated by power management circuitry within integrated circuit 25, for example as part of system control 24 (FIG. 2).

Power supply switch circuitry 42 includes controllable switches 47, 48. Switches 47, 48 are connected to and controlled by switch logic 46, which receives signal READ_ONLY from elsewhere in integrated circuit 25 (e.g., system control 24). It is contemplated that switches 47, 48 can each be realized by conventional pass transistors (or a pair of pass transistors connected in parallel), or by other switching logic or circuitry conventional in the art. Signal READ_ONLY indicates the mode into which SRAM 35 is to be placed, namely a read-only mode or a read/write mode. Switch 47 in power supply switch circuitry 42 selectably connects array power supply voltage $V_{dd}(AR)$ to voltage $V_{dd}(AR\_RW)$ in the read/write mode, and to a lower voltage $V_{dd}(AR\_RO)$ in the read-only mode; similarly, switch 48 selectably connects periphery power supply voltage $V_{dd}(PR)$ to voltage $V_{dd}(PR\_RW)$ in the read/write mode, and to a lower voltage $V_{dd}(PR\_RO)$ in the read-only mode. The particular voltage levels used for voltages $V_{dd}(AR\_RW)$, $V_{dd}(AR\_RO)$, $V_{dd}(PR\_RW)$, and $V_{dd}(PR\_RO)$, depends upon the static noise margins and write margins of SRAM 35, and more particularly upon the value of these margins desired by the designer. It is contemplated, according to this invention, that the voltage difference between the read/write and read-only modes can be substantial, for example on the order of a 25% difference; this substantial difference translates into significant power savings to the extent that SRAM 35 can be operated in the read-only mode. If, for example, read/write mode voltages $V_{dd}(AR\_RW)$ and $V_{dd}(PR\_RW)$ are each at about 1.00 volts to 1.10 volts, it is contemplated that read-only mode voltages $V_{dd}(AR\_RO)$ and $V_{dd}(PR\_RO)$ may be on the order of 0.75 volts. Again, these levels will depend on the level of static noise margin that can be tolerated by SRAM 35 at the lower read-only mode voltages.

If more than one particular SRAM memory resource within integrated circuit 25 can be placed in read-only mode, signal READ_ONLY may be a multiple-bit digital signal, or communicated on multiple signal lines, to a shared power supply switch circuit 42 in order to distinguish the particular memory resource that can be placed in read-only mode. In that case, of course, power supply switch circuit 42 would provide multiple pairs of switches, one for each of the controlled SRAM resources.

Of course, other circuits or architectures for controlling the power supply voltages that are applied to the SRAM memory resources of integrated circuit 25 in the various operating modes can alternatively be used. For example, voltage regulator circuitry may be provided to divide-down or otherwise level convert the power supply voltages to be applied as $V_{dd}(AR)$ and $V_{dd}(PR)$, from a higher master power supply voltage. Further in the alternative, integrated circuit 25 may issue external control signals that can be used to tune one or more of external power supply voltages according to the operating mode of the SRAM memory resources. It is contemplated that these and other alternatives may be realized in connection with this invention, as will be appreciated by those skilled in the art having reference to this specification.

In addition, while the embodiments of this invention are described in connection with "two-rail" power supply voltages (i.e., separate and independent array and periphery power supply voltages $V_{dd}(AR)$ and $V_{dd}(PR)$, respectively), these embodiments of the invention can also be readily applied to "single-rail" implementations in which a single power supply voltage is applied to both the array and the periphery of the SRAM memories, and controlled for read-only and read/write modes in the manner described below. Further in the alternative, in the "two-rail" arrangement, only array power supply voltage $V_{dd}(AR)$ may be reduced in the read-only mode, while leaving periphery power supply voltage $V_{dd}(PR)$ at a constant level in both modes; of course, the reduction in power consumption will not be as dramatic in this case. In addition, the power supply voltage applied to write circuit 41 need not be lowered in the read-only mode, or may be driven to ground if desired, considering that no write operations will be performed during the "read-only" operating mode.

Figure 4A:
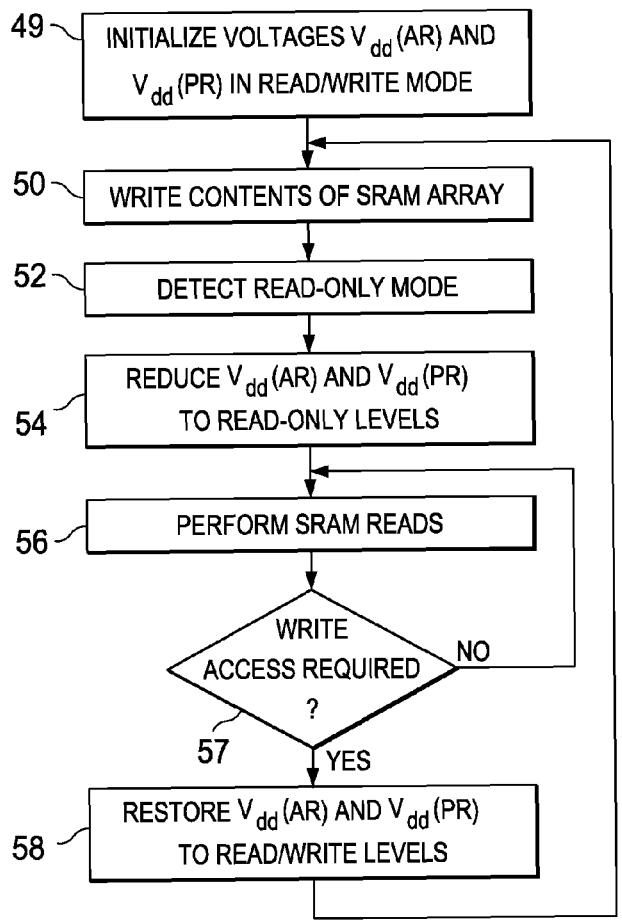
FIGS. 4a through 4c are flow diagrams illustrating the operation of the system of FIG. 2 according to respective embodiments of the invention.

Referring now to FIG. 4a, the operation of integrated circuit 25 according to a first approach for reducing the power supply voltage applied to one of its static RAM resources will now be described. For the embodiment of the invention according to that shown in FIGS. 2 and 3, entry into and operation within read-only mode will be described in connection with the placing of a generic SRAM 35, for example a separable array or other portion of general-purpose RAM 30, or programmable LUT RAM 34. It is contemplated that the use of this read-only mode for saving power relative to SRAM resources is especially useful and available in connection with programmable look-up tables (LUT RAM 34). Such memory resources are typically programmable, in the sense that a particular set of coefficients used in a digital filter or for transforming data expressed in one form or scale to another can be written or initialized to correspond to a selected algorithm. However, these look-up table contents, once programmed, will remain in their programmed state for an extended time or number of operations, and will not be modified during that time. As such, according to this embodiment of the invention, LUT RAM 34 can be operated in a read-only mode after it is initially written with the desired contents, and in this read-only mode its power supply voltages can be reduced substantially without deleteriously affecting performance. In this embodiment of the invention, SRAM 35 will thus correspond to LUT RAM 34, or to a particular SRAM array 40 within RAM 30, of system 20 of FIG. 2.

The process of FIG. 4a for operating SRAM 35 begins with process 49 in which the power supply voltages applied to SRAM 35 are those corresponding to the read/write mode, in which array power supply voltage $V_{dd}(AR)$ and periphery power supply voltage $V_{dd}(PR)$ are set to their higher levels. In the example of FIG. 3, in this read/write mode, system control 24 issues, to power supply switch circuitry 42, a value of signal READ_ONLY corresponding to the read/write mode. In response, switch logic 46 controls switch 47 to couple array power supply voltage $V_{dd}(AR)$ to voltage $V_{dd}(AR\_RW)$, and controls switch 48 to connect periphery power supply voltage $V_{dd}(PR)$ voltage $V_{dd}(PR\_RW)$. After a suitable delay to allow those power supply voltages to settle, the contents of SRAM 35 (e.g., LUT RAM 34) are then written or initialized in process 50, according to the conventional manner.

In process 52, system control 24 or some other control function in integrated circuit 25 determines that this SRAM 35 can be operated in read-only mode. For example, a control algorithm may be implemented in system control 24 or by microprocessor 22, in which the status of SRAM 35 as read-only is determined or otherwise set. It is contemplated that this determination will be made according to the intended use of the contents written to SRAM 35. For example, if system control 24 or microprocessor 22 has knowledge that LUT RAM 34 is allocated as a look-up table, this knowledge or determination can provoke system control 24 to place SRAM 35 into the read-only mode. Of course, other uses of SRAM 35 can also be presumed to involve a large number of read operations between write operations. Regardless of the manner in which this determination is made, according to the example of FIG. 3, signal READ_ONLY is then issued, in process 52, at a level or value indicating that SRAM 35 is to enter read-only mode.

In response to this signal READ_ONLY, according to this embodiment of the invention as shown in FIGS. 2 and 3, power supply switch circuitry 42 applies array power supply voltage $V_{dd}(AR)$ and periphery power supply voltage $V_{dd}(PR)$ at reduced voltages, relative to those applied during write process 50. In the example of FIG. 3, switches 47, 48 are controlled by switch logic 46 to connect array power supply voltage $V_{dd}(AR)$ to voltage $V_{dd}(AR\_RO)$, and to connect periphery power supply voltage $V_{dd}(PR)$ to voltage $V_{dd}(PR\_RO)$, respectively. Once these power supply voltages have settled, SRAM 35 is then operated to carry out the desired read operations, in process 56.

In this example, it is contemplated that it may become necessary to write data to SRAM 35 at some point during the operation of integrated circuit 25, even after SRAM 35 has been biased in read-only mode. For example, because of a user input or other operational change, it may become necessary to change the contents of LUT RAM 34. In this embodiment of the invention as shown in FIG. 4a, decision 57 is executed by system control 24 or some other function to determine whether a write access to SRAM 35 is required or requested; if not (decision 57 is NO), then read accesses of SRAM 35, biased to the read-only power supply voltages $V_{dd}(AR\_RO)$ and $V_{dd}(PR\_RO)$ continue in process 56.

If a write to one or more locations of SRAM 35 is being requested or is otherwise required (decision 57 is YES), then system control 24 changes the value of signal READ_ONLY applied to power supply switch circuitry 42, to reflect that SRAM 35 is to be biased according to the read/write mode. In this example (FIG. 3), switch logic 46 controls switch 47 to connect array power supply voltage $V_{dd}(AR)$ to voltage $V_{dd}(AR\_RW)$, and controls switch 48 to connect periphery power supply voltage $V_{dd}(PR)$ to voltage $V_{dd}(PR\_RW)$. Once the read/write mode power supply voltages have settled, control then returns to process 50, in which the contents of SRAM 35 are written at these read/write mode power supply voltages, and the process of read-only bias and operation repeated if applicable.

Substantial time is typically required for array power supply voltage $V_{dd}(AR)$ and periphery power supply voltage $V_{dd}(PR)$ to change from one voltage to another, especially for a significant voltage change, such as on the order of 25% as in this embodiment of the invention. As known in the art, memory accesses are best performed under stable power supply voltage bias, because operational instability and data error can occur if read and write operations are performed while the memory power supply voltages are "slewing" from one voltage to another. Accordingly, some delay is preferably included within processes 54, 58, in which array power supply voltage $V_{dd}(AR)$ and periphery power supply voltage $V_{dd}(PR)$ are changed between read/write and read-only modes. For example, the delay required to change the power supply voltages between modes can be on the order of one hundred cycle times (i.e., the time required to perform one hundred read cycles).

The length of this delay, and the frequency at which the delay occurs in normal operation, can be considered in evaluating the trade-off between the slowdown in memory performance due to switching between read-only and read/write modes, versus the reduced power consumption enjoyed during read-only mode. It is contemplated that those skilled in the art having reference to this specification can readily evaluate this cost-benefit decision in making the design decisions involved in configuration of a specific system.

Figure 4C:
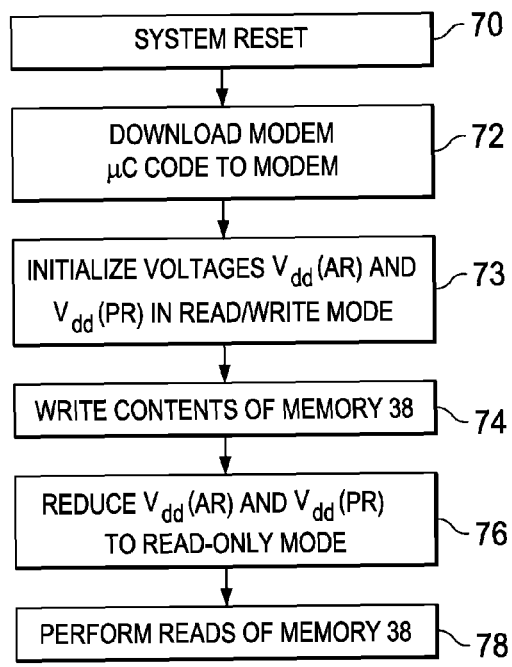
Figure 4B:
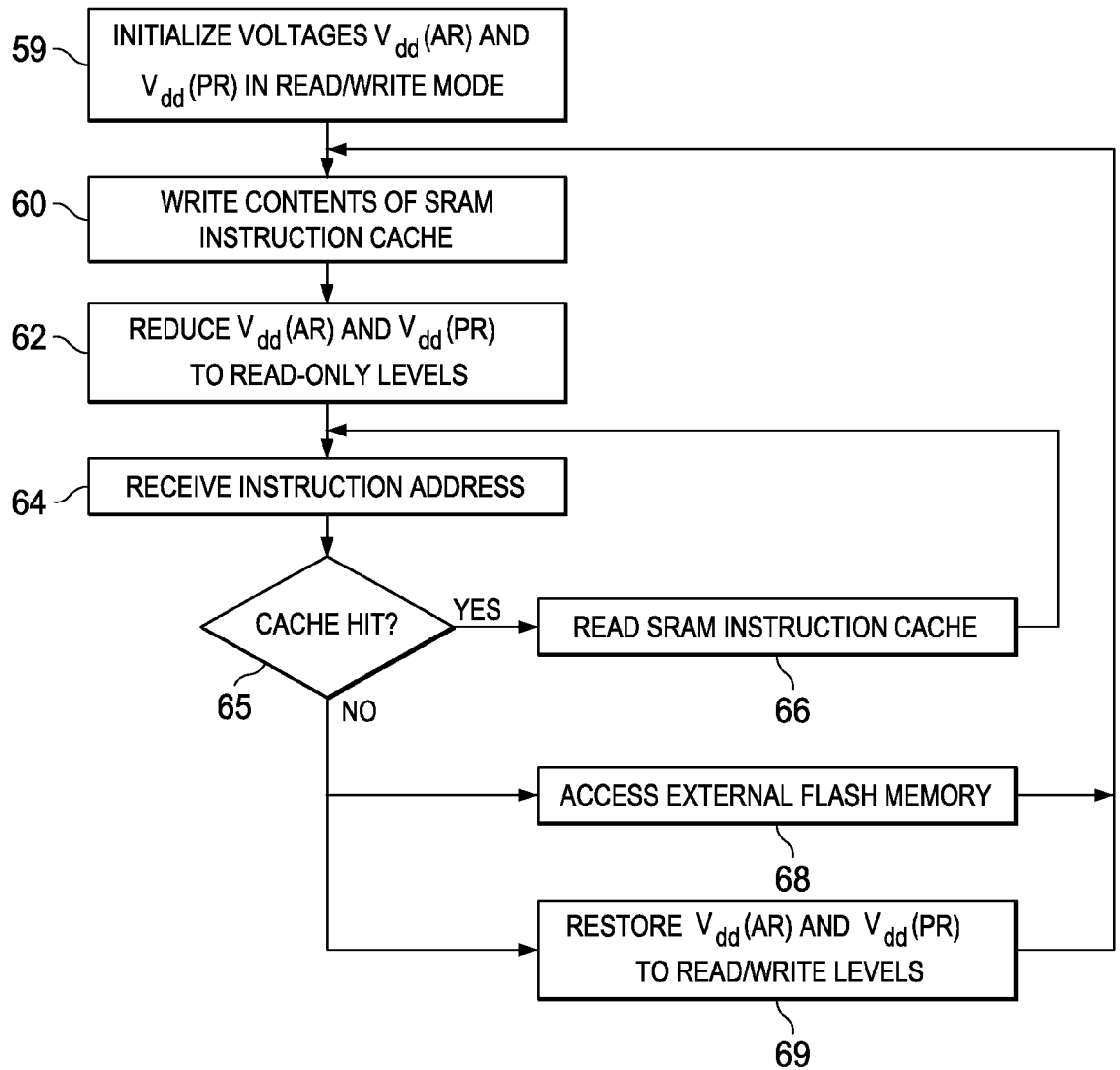

According to another embodiment of the invention, however, the effect of this power supply voltage slew delay can be greatly minimized in some uses of the read-only mode. In the example shown in FIG. 2, microprocessor 22 includes SRAM instruction cache 36, while external flash memory 33 is accessible to microprocessor 22 via system bus SBUS and external memory interface 23. In the case that external flash memory 33 serves as the program memory of system 20, an internal SRAM instruction cache 36 can provide important improvement to overall system performance, to the extent that the instructions executed by microprocessor 22 can be stored within SRAM instruction cache 36 during operation. In this situation, according to this embodiment of the invention, SRAM instruction cache 36 can be biased according to the read-only mode to reduce power consumption while minimizing the performance degradation caused by the necessary delays in slewing the power supply voltages. This embodiment of the invention will now be described in connection with FIG. 4b.

In this embodiment of the invention, SRAM instruction cache 36 first has its array power supply voltage $V_{dd}$(AR) and periphery power supply voltage $V_{dd}$(PR) initialized to their higher levels of the read/write mode, in process 59. Process 59 is carried out by way of power supply switch circuitry 42 in the manner described above relative to process 49. After elapse of the necessary settling delay, SRAM instruction cache 36 is then written with new contents corresponding to instructions executable by microprocessor 22, for example in the form of "opcodes" or other machine-readable instruction codes, in process 60. As known in the art for cache memories, not only are these contents stored in SRAM instruction cache 36, but some memory locations (either within or outside of the same memory array) are written with "tag" values corresponding to the memory addresses of the contents stored in the cache itself. These tags are used, by cache tag logic included within SRAM instruction cache 36 itself or elsewhere in microprocessor 22, to determine whether an instruction to be fetched by microprocessor 22 is currently stored in SRAM instruction cache 36 (a cache "hit") or must be fetched from external flash memory 33 or another memory location outside of SRAM instruction cache 36 (a cache "miss"). Of course, the particular arrangement of SRAM instruction cache 36 can vary widely among conventional cache types and architectures. In any case, write process 60 is carried out in the read/write mode, during which array power supply voltage $V_{dd}$(AR) is at voltage $V_{dd}$(AR_RW), and periphery power supply voltage $V_{dd}$(PR) is at voltage $V_{dd}$(PR_RW).

Following the writing of the contents of SRAM instruction cache 36, system control 24 (or perhaps microprocessor 22 itself) issues signal READ_ONLY to reduce array power supply voltage $V_{dd}$(AR) and periphery power supply voltage $V_{dd}$(PR) applied to SRAM instruction cache 36 to their read-only power supply voltages $V_{dd}$(AR_RO) and $V_{dd}$(PR_RO). In the example of FIG. 3, power supply control circuitry 42 carries out process 62 by causing switches 47, 48 to connect array power supply voltage $V_{dd}$(AR) to voltage $V_{dd}$(AR_RO), and periphery power supply voltage $V_{dd}$(PR) to voltage $V_{dd}$(PR_RO), respectively, followed by any necessary delay to allow the new voltages to settle.

In process 64, microprocessor 22 generates or receives the instruction address for the next instruction to be fetched from memory, whether in SRAM instruction cache 36 or in external flash memory 33 (in this example), and compares that instruction to the corresponding tag memory that indicates the addresses of those instructions that reside in SRAM instruction cache 36 in decision 65. If the new instruction address corresponds to an instruction that is currently stored in SRAM instruction cache 36 (decision 65 is YES), then the corresponding instruction code is read from SRAM instruction cache 36, in process 66. In this example, this read operation is performed with SRAM instruction cache 36 in read-only mode, with array power supply voltage $V_{dd}$(AR) at voltage $V_{dd}$(AR_RO) and periphery power supply voltage $V_{dd}$(PR) at voltage $V_{dd}$(PR_RO). Control then returns to process 64, awaiting the next instruction address.

However, if the new instruction address does not match the address of an instruction stored in SRAM instruction cache 36 (decision 65 is NO), the desired instruction code resides in external flash memory 33 in this example. In process 68, as a result, microprocessor 22 accesses external flash memory 33 to obtain the desired instruction code, as well as the contents of surrounding memory addresses (i.e., instructions) according to the particular cache algorithm being followed. As known in the art, the latency of an access to flash memory can be quite large, especially as compared against a cycle time of accessing local SRAM (especially cache memory, such as SRAM instruction cache 36). For example, this latency time can be on the order of hundreds of cache access cycles.

While this external memory latency cannot be avoided in the event of a cache miss, according to this embodiment of the invention, this latency is taken advantage of to save power consumption. In particular, array power supply voltage $V_{dd}$(AR) and periphery power supply voltage $V_{dd}$(PR) applied to SRAM instruction cache 36 are restored to their read/write mode levels (i.e., voltages $V_{dd}$(AR_RW) and $V_{dd}$(PR_RW), respectively) in process 69, during the latency time involved in the external access being performed in process 68. Process 69 is performed in the manner described above relative to process 58 of FIG. 4a, but of course is applied to SRAM instruction cache 36. It is contemplated that, in most cases, the external access latency time will provide more than enough time for array power supply voltage $V_{dd}$(AR) and periphery power supply voltage $V_{dd}$(PR) to stabilize, at SRAM instruction cache 36, to their read/write mode levels. Even if not, the performance penalty due solely to modulating the SRAM power supply voltages is mitigated by the latency involved in a cache miss. Upon receiving the accessed contents of external flash memory 33, at the completion of process 68, process 60 can then be executed to write those contents to SRAM instruction cache 36.

According to this embodiment of the invention, therefore, the delay time penalty involved in slewing array power supply voltage $V_{dd}$(AR) and periphery power supply voltage $V_{dd}$(PR) is substantially reduced, considering that this delay can be enforced during the external memory access time. As a result, the substantial reduction in power consumption made available according to this invention, when applied to an instruction cache memory, can be attained at a reduced impact on memory performance.

The system of FIG. 2 can take additional advantage of this invention, due to a particular facet of its architecture, according to another embodiment of this invention. It is contemplated that this particular architectural feature is also often available in many modern digital systems, particularly those used to realize smartphones and other cellular telephone handsets.

As shown in FIG. 2, modem microcontroller 28 is associated with its own local instruction memory 38, which is in the form of static RAM such as described above relative to SRAM 35, and which serves as the program memory for modem microcontroller 28 in its function of providing data communications for system 20 over an RF or other communications link (not shown). In this example, local instruction memory 38 is local in the sense that it does not reside on system bus SBUS, but instead is only directly accessible to modem microcontroller 28. Local instruction memory 38 is not operating in the sense of a cache memory in this example (i.e., instruction addresses are not being compared to see whether they are within local instruction memory 38, and external accesses are not performed if not), but rather is accessed in random access fashion. Because of the construction of system 20, however, the contents of local instruction memory 38 will typically not be changed (i.e., written) during the operation of modem microcontroller 28. This behavior of local instruction memory 38 is used to advantage in connection with another embodiment of the invention, as will now be described relative to FIG. 4c.

The use of local instruction memory 38, according to this embodiment of the invention, begins with reset of system 20, in process 70. As known in the art, system reset process 70 can be initiated by power-on of system 20, or alternatively by the system user causing or initiating a system reset from a powered state of system 20. In either case, as a result of system reset process 70, the program code for modem microcontroller 28 is downloaded to modem microcontroller 28 from another memory resource in system 20, in process 72. For example, this modem program code may reside in ROM 32, or another non-volatile memory resource such as external flash memory 33. In any event, the program memory of modem microcontroller 28 is effectively emptied upon system reset process 70, and download process 72 returns that program code to modem microcontroller 28. In process 73, array power supply voltage $V_{dd}(AR)$ and periphery power supply voltage $V_{dd}(PR)$ are applied to SRAM array 40 of local instruction memory 38 at their read/write mode levels, in the manner described above relative to FIGS. 3, 4a, and 4b, in connection with processes 49, 59. After the requisite delay to allow these power supply voltages to settle at these read/write mode levels, the downloaded program code is then written to local instruction memory 38, in process 74.

Because local instruction memory 38 for modem microcontroller 28, once written with the modem program instructions, is then not rewritten or modified during the operation of modem microcontroller 28, local instruction memory 38 operates as a read-only memory for all practical purposes. According to this embodiment of the invention, therefore, SRAM array 40 of local instruction memory 38 is then biased into its read-only mode, in process 76. It is contemplated that some control circuitry either within modem microcontroller 28 or in system control 24 will issue the equivalent value of signal READ_ONLY to power supply switch circuitry 42 of local instruction memory 38, to cause this reduction of array power supply voltage $V_{dd}(AR)$ and periphery power supply voltage $V_{dd}(PR)$ to their read-only voltages $V_{dd}(AR\_RO)$ and $V_{dd}(PR\_RO)$, respectively, in the manner described above relative to processes 54, 62. After the settling delay for these voltages, the contents of local instruction memory 38 are read by modem microcontroller 28 as appropriate for the operation of the modem function of system 20, in process 78. Because local instruction memory 38 is not rewritten or modified in this example, this read-only power supply bias and operation of local instruction memory 38 can continue for the duration of the operation of system 20, until the next system reset event in which the downloading and reloading of program code for the modem function is repeated.

It is contemplated that the ability to operate static RAM arrays in a read-only mode, in which lower power supply voltages are applied to the array and periphery of the SRAM arrays, can substantially reduce the power consumed by those SRAM resources. Not only is the applied voltage reduced, but it has been observed that the current draw of these SRAM arrays is reduced, thus providing a multiplicative reduction in the voltage-current product. In one example of a 256 kbit SRAM array, a reduction in the periphery power supply voltage $V_{dd}(PR)$ from a nominal level of 1.08 volts to 0.76 volts, in combination with a reduction of array power supply voltage $V_{dd}(AR)$ of 0.16 volts, was observed to result in a 10% reduction in the active read cycle current drawn and a 53% reduction in the standby current drawn, as compared with the current that would have been drawn for those operations at the higher bias levels. These reduced power supply voltages still maintained an acceptable static noise margin (FOM=5.3), such that the reduced power consumption was attained with no degradation in stability. This power consumption would be provided according to each of the embodiments of this invention described above, and similar power savings would be expected from the reduction of power supply voltages for a read-only mode for any SRAM array to which the invention can be applied.

While the present invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as claimed herein.

What is claimed is:

1. A random access memory in an integrated circuit, comprising:
   an array of memory cells;
   read circuitry for sensing contents of selected memory cells in the array in a read operation;
   write circuitry for writing contents of selected memory cells in the array in a write operation; and
   power supply switch circuitry for applying a first power supply voltage to the array responsive to a control signal indicating that the memory is to operate in a read/write mode, and for applying a second power supply voltage to the array responsive to a control signal indicating that the memory is to operate in a read-only mode, wherein the second power supply voltage is lower than the first power supply voltage.

2. The memory of claim 1, wherein the power supply switch circuitry is also applying a first power supply voltage to the read circuitry responsive to a control signal indicating that the memory is to operate in a read/write mode, and for applying a second power supply voltage to the read circuitry responsive to a control signal indicating that the memory is to operate in a read-only mode, wherein the second power supply voltage is lower than the first power supply voltage.

3. The memory of claim 2, wherein the first power supply voltage applied to the array is the same voltage as the first power supply voltage applied to the read circuitry and write circuitry;
   and wherein the second power supply voltage applied to the array is the same voltage as the second power supply voltage applied to the read circuitry.

4. The memory of claim 2, wherein the first power supply voltage applied to the array is a different voltage from the first power supply voltage applied to the read circuitry;
   and wherein the second power supply voltage applied to the array is a different voltage from the second power supply voltage applied to the read circuitry.

5. The memory of claim 1, wherein the array of memory cells comprises an array of static random access memory cells.

6. The memory of claim 1, wherein the power supply switch circuitry comprises:
   a first switch for selectably coupling an array power supply voltage conductor to a one of the first and second power supply voltages, the array power supply voltage conductor being connected to memory cells in the array; and
switch logic circuitry, for controlling the state of the first switch responsive to a control signal.

7. The memory of claim 6, wherein the power supply switch circuitry is also applying a third power supply voltage to the read circuitry and write circuitry responsive to a control signal indicating that the memory is to operate in a read/write mode, and for applying a fourth power supply voltage to the read circuitry responsive to a control signal indicating that the memory is to operate in a read-only mode, wherein the fourth power supply voltage is lower than the third power supply voltage;
wherein the power supply switch circuitry further comprises:
a second switch for selectably coupling an periphery power supply voltage conductor to one of the third and fourth power supply voltages, the periphery power supply voltage conductor being connected to the read circuitry;
and wherein the switch logic is also for controlling the state of the first switch responsive to the control signal.

8. The memory of claim 1, wherein the power supply switch circuitry comprises:
voltage regulator circuitry for generating the array power supply voltage at a selected one of the first and second power supply voltages, from a master power supply voltage, responsive to a control signal.

9. An electronic system, comprising:
a microprocessor, coupled to a system bus;
system control circuitry, coupled to the microprocessor; and
a random access memory, comprising:
an array of memory cells;
read circuitry for sensing contents of selected memory cells in the array in a read operation;
write circuitry for writing contents of selected memory cells in the array in a write operation; and
power supply switch circuitry, coupled to receive a control signal from the system control circuitry, for applying a first power supply voltage to the array responsive to the control signal indicating that the memory is to operate in a read/write mode, and for applying a second power supply voltage to the array responsive to the control signal indicating that the memory is to operate in a read-only mode, wherein the second power supply voltage is lower than the first power supply voltage.

10. The system of claim 9, wherein the microprocessor, system control circuitry, and random access memory are located in a single integrated circuit.

11. The system of claim 9, wherein the power supply switch circuitry is also for applying a first power supply voltage to the read circuitry responsive to the control signal indicating that the memory is to operate in a read/write mode, and for applying a second power supply voltage to the read circuitry responsive to the control signal indicating that the memory is to operate in a read-only mode;
wherein the first power supply voltage applied to the array is the same voltage as the first power supply voltage applied to the read circuitry and write circuitry;
and wherein the second power supply voltage applied to the array is the same voltage as the second power supply voltage applied to the read circuitry.

12. The system of claim 9, wherein the power supply switch circuitry is also for applying a third power supply voltage to the read circuitry and write circuitry responsive to the control signal indicating that the memory is to operate in a read/write mode, and for applying a fourth power supply voltage to the read circuitry responsive to the control signal indicating that the memory is to operate in a read-only mode;
wherein the first power supply voltage differs from the third power supply voltage;
and wherein the second power supply voltage differs from the fourth power supply voltage.

13. The system of claim 9, wherein the random access memory comprises a cache memory accessible to the microprocessor, the cache memory associated with cache logic circuitry for determining whether an address requested by the microprocessor corresponds to contents of the random access memory;
and further comprising:
a program memory resource, coupled to the system bus;
wherein the power supply switch circuitry is for applying the second power supply voltage to the array after the cache memory has been written;
and wherein the power supply switch circuitry is for applying the first power supply voltage to the array responsive to the cache logic circuitry determining that an address requested by the microprocessor does not correspond to contents of the random access memory.

14. The system of claim 9, further comprising:
a microcontroller coupled to the system bus; and
a program memory resource, coupled to the system bus;
wherein the random access memory comprises a local memory accessible to the microcontroller;
wherein the power supply switch circuitry is for applying the first power supply voltage to the array responsive to a system reset operation;
and wherein the power supply switch circuitry is for applying the second power supply voltage to the array after the local memory has been written with contents retrieved from the program memory resources, following the system reset operation.

15. A method of operating a random access memory, comprising the steps of:
applying a first power supply voltage to an array of memory cells;
writing contents to one or more selected memory cells in the array;
then applying a second power supply voltage to the array of memory cells, the second power supply voltage being a lower voltage than the first power supply voltage; and
then reading the contents of one or more selected memory cells in the array.

16. The method of claim 15, further comprising:
after the reading step, determining that a write operation is to be performed to one or more memory cells in the array;
then applying the first power supply voltage to the array of memory cells;
then writing contents to one or more selected memory cells in the array;
then again applying the second power supply voltage to the array of memory cells; and
then reading the contents of one or more selected memory cells in the array.

17. The method of claim 16, wherein the step of applying the first power supply voltage also applies the first power supply voltage to read circuitry associated with the array;
and wherein the step of applying the second power supply voltage also applies the first power supply voltage to the read circuitry.

18. The method of claim 15, further comprising:

before the writing step, applying a third power supply voltage to read circuitry associated with the array; and
after the writing step and before the reading step, applying a fourth power supply voltage to the read circuitry, the fourth power supply voltage being a lower voltage than the third power supply voltage.

19. The method of claim 18, further comprising:

after the reading step, determining that a write operation is to be performed to one or more memory cells in the array;
then applying the first power supply voltage to the array of memory cells and the third power supply voltage to the read circuitry and the write circuitry;
then writing contents to one or more selected memory cells in the array;
then again applying the second power supply voltage to the array of memory cells and the fourth power supply voltage to the read circuitry; and
then reading the contents of one or more selected memory cells in the array.

20. The method of claim 15, wherein the array of memory cells comprises a cache memory; and further comprising:

after the step of applying the second power supply voltage to the array of memory cells, receiving an instruction fetch address;
responsive to the instruction fetch address corresponding to an address associated with contents of the cache memory, performing the reading step; and
responsive to the instruction fetch address corresponding to an address not associated with contents of the cache memory:
  accessing a second array of memory cells;
  applying the first power supply voltage to the array of memory cells during at least a portion of the accessing step;
  then writing contents to one or more selected memory cells in the array; and
  then again applying the second power supply voltage to the array of memory cells.

21. The method of claim 15, wherein the step of applying the first power supply voltage to the array of memory cells is performed responsive to a system reset of an integrated circuit comprising the random access memory.

\* \* \* \* \*